(12) United States Patent
Li et al.

(10) Patent No.: US 11,246,212 B2
(45) Date of Patent: Feb. 8, 2022

(54) PRINTED CIRCUIT BOARD DEFORMABLE IN BOTH LENGTH AND WIDTH

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Wei-Xiang Li, Shenzhen (CN); Ming-Liang Zuo, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 23 days.

(21) Appl. No.: 16/448,114

(22) Filed: Jun. 21, 2019

(65) Prior Publication Data

US 2019/0306974 A1 Oct. 3, 2019

Related U.S. Application Data

(62) Division of application No. 15/701,758, filed on Sep. 12, 2017, now Pat. No. 10,499,496.

(30) Foreign Application Priority Data

Oct. 14, 2016 (CN) .......................... 201610900164.9

(51) Int. Cl.
*H05K 1/02* (2006.01)
*H05K 1/03* (2006.01)
(Continued)

(52) U.S. Cl.
CPC ......... *H05K 1/0283* (2013.01); *H05K 1/0326* (2013.01); *H05K 1/115* (2013.01);
(Continued)

(58) Field of Classification Search
CPC ... H05K 2201/0311; H05K 2201/0314; H05K 2201/09609; H05K 2201/9681; H05K 1/0283; H05K 1/0287
See application file for complete search history.

(56) References Cited

U.S. PATENT DOCUMENTS 4,689,442 A * 8/1987 Ozaki ...................... B32B 3/12
174/266
5,753,976 A * 5/1998 Harvey .................. H05K 1/115
257/693
(Continued)

FOREIGN PATENT DOCUMENTS

| CN | 1165608 A | 11/1997 |
|---|---|---|
| CN | 101505575 A | 8/2009 |

(Continued)

*Primary Examiner* — Paresh H Paghadal
(74) *Attorney, Agent, or Firm* — ScienBiziP, P.C.

(57) ABSTRACT

A printed circuit board deformable in both length and width includes a first conductive circuit layer, a second conductive circuit layer, an elastic film, and conductive via holes. The first conductive circuit layer includes first conductive circuits. First honeycomb holes are defined on the first conductive circuits. The second conductive circuit layer faces away from the first conductive circuit layer, the second conductive circuit layer comprises second conductive circuits, second honeycomb holes being defined on the second conductive circuits, each of the second honeycomb holes corresponds to one of the first honeycomb holes. The first conductive circuits are embedded in the elastic film. Each of the conductive via holes corresponds to one first honeycomb holes.

9 Claims, 3 Drawing Sheets

(51) Int. Cl.
*H05K 1/11* (2006.01)
*H05K 3/16* (2006.01)
*H05K 3/18* (2006.01)
*H05K 3/40* (2006.01)
*H05K 3/42* (2006.01)

(52) U.S. Cl.
CPC ............... *H05K 3/16* (2013.01); *H05K 3/188* (2013.01); *H05K 3/4038* (2013.01); *H05K 3/426* (2013.01); *H05K 2201/0959* (2013.01)

(56) References Cited

U.S. PATENT DOCUMENTS

| | | | | |
|---|---|---|---|---|
| 5,764,485 A | * | 6/1998 | Lebaschi | H05K 1/113 361/774 |
| 6,043,986 A | * | 3/2000 | Kondo | H05K 1/0206 174/252 |
| 6,448,650 B1 | * | 9/2002 | Saran | H01L 24/03 257/750 |
| 6,701,259 B2 | * | 3/2004 | Dor | H01L 22/20 257/E21.525 |
| 2005/0029014 A1 | * | 2/2005 | Miura | H05K 3/426 174/262 |
| 2006/0032670 A1 | * | 2/2006 | Haba | H01L 23/49827 174/267 |
| 2008/0186682 A1 | * | 8/2008 | Sugimura | H05K 1/0206 361/720 |
| 2013/0062754 A1 | * | 3/2013 | Fujii | H01L 23/49827 257/734 |
| 2013/0192885 A1 | * | 8/2013 | Lee | H05K 3/0058 174/258 |
| 2013/0278568 A1 | * | 10/2013 | Lasiter | H01L 27/12 345/204 |

FOREIGN PATENT DOCUMENTS

| | | | | | |
|---|---|---|---|---|---|
| JP | H09148691 | | * | 9/1995 | ........... H05K 1/0201 |
| JP | 2005235840 A | * | | 9/2005 | ............... H05K 1/02 |
| JP | 2013247293 A | * | | 12/2013 | ......... H01L 23/4334 |
| WO | 2016057231 A1 | | | 4/2016 | |

* cited by examiner

PRINTED CIRCUIT BOARD DEFORMABLE IN BOTH LENGTH AND WIDTH

CROSS-REFERENCE TO RELATED APPLICATIONS

This is a divisional application of patent application Ser. No. 15/701,758, filed on Sep. 12, 2017, 2017-09-12 entitled "LENGTH-AND WIDTH-DEFORMABLE PRINTED CIRCUIT BOARD AND METHOD FOR MANUFACTURING THE SAME", assigned to the same assignee, which is based on and claims priority to China Patent Application No. 201610900164.9 filed on Oct. 14, 2016, the contents of which are incorporated by reference herein.

FIELD

The subject matter generally relates to printed circuit boards.

BACKGROUND

Flexible printed circuits are used in various kinds of electronic devices. Although the flexible printed circuit can bend to an extent, stretching the board would cause cracks and signal transmission instability in the circuit.

BRIEF DESCRIPTION OF THE DRAWINGS

Implementations of the present disclosure will now be described, by way of example only, with reference to the attached figures.

DETAILED DESCRIPTION OF EMBODIMENTS

Figure 1:
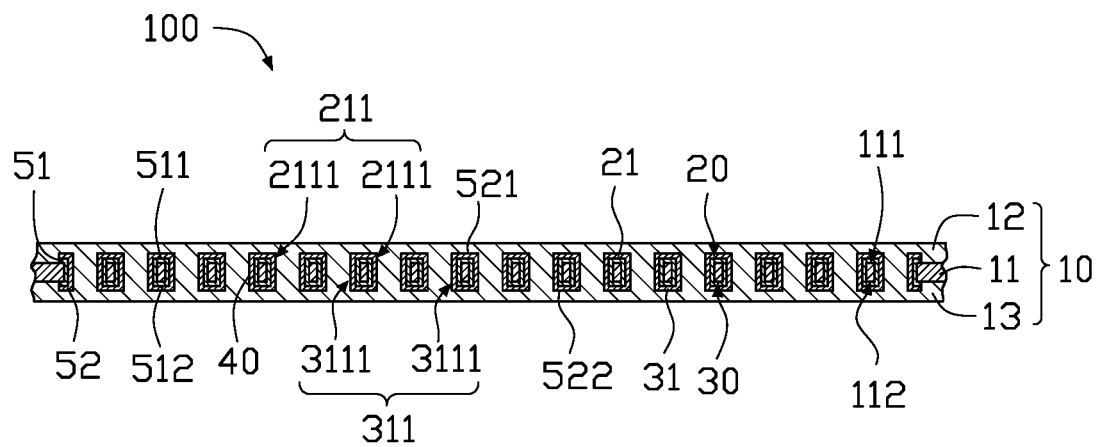
FIG. 1 is a cross-sectional view of an exemplary embodiment of a length- and width-deformable printed circuit board of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

Figure 2:
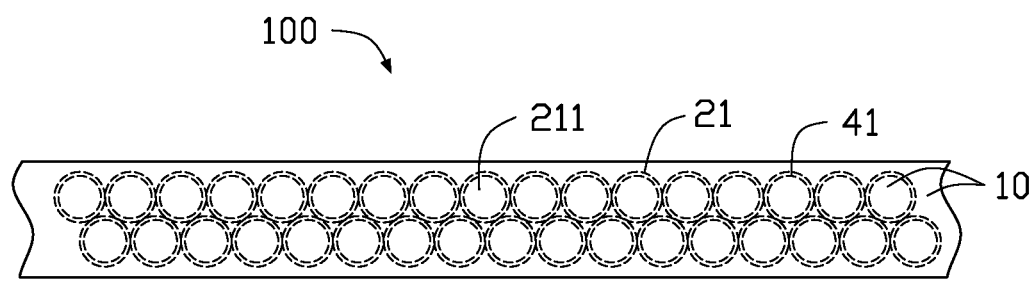
FIG. 2 is a top view of the printed circuit board of FIG. 1.

FIG. 1 and FIG. 2 illustrate an exemplary embodiment of a printed circuit board deformable in both length and width (printed circuit board 100). The printed circuit board 100 can be a single-sided board, a multi-layered flexible board, a multi-layered IC carrier, or a multi-layered rigid-flexible board.

In at least one exemplary embodiment, the board 100 is a double-layered printed circuit board.

The printed circuit board 100 includes an elastic film 10, a first conductive circuit layer 20, and a second conductive circuit layer 30. The first conductive circuit layer 20 and the second conductive circuit layer 30 are embedded in the elastic film 10.

The elastic film 10 includes an elastic via 11, a first elastic cover layer 12, and a second elastic cover layer 13. The elastic via 11 includes a first surface 111 and a second surface 112 facing away from the first surface 111. The first conductive circuit layer 20 is formed on the first surface 111. The second conductive circuit layer 30 is formed on the second surface 112. The elastic via 11, the first conductive circuit layer 20, and the second conductive circuit layer 30 are sandwiched between the first elastic cover layer 12 and the second elastic cover layer 13.

The elastic via 11, the first elastic cover layer 12, and the second elastic cover layer 13 are electrically insulated from each other.

In at least one exemplary embodiment, the elastic via 11, the first elastic cover layer 12, and the second elastic cover layer 13 can be made of polydimethylsiloxane (PDMS).

In at least one exemplary embodiment, the first conductive circuit layer 20 includes a part of a metal layer 51 on the first surface 111 and a part of an electroplated copper layer 52 formed on the metal layer 51.

The metal layer 51 includes a third surface 511 and a fourth surface 512 facing away from the third surface 511. The third surface 511 faces away from the first surface 111 and is on the same side with the first surface 111. The fourth surface 512 faces away from the second surface 112 and is on the same side with the second surface 112.

In at least one exemplary embodiment, the second conductive circuit layer 30 includes another part of the metal layer 51 on the second surface 112 and another part of the electroplated copper layer 52 formed on the metal layer 51.

The electroplated copper layer 52 includes a fifth surface 521 and a sixth surface 522 facing away from the fifth surface 521. The fifth surface 521 faces away from the third surface 511 and is on the same side with the first surface 111 and the third surface 511. The sixth surface 522 faces away from the fourth surface 512 and is on the same side with the fourth surface 512 and the second surface 112. The first elastic cover layer 12 covers the fifth surface 521 of the electroplated copper layer 52. The second elastic cover layer 13 covers the sixth surface 522 of the electroplated copper layer 52.

In at least one exemplary embodiment, the first conductive circuit layer 20 is defined as the third surface 511 of the metal layer 51 formed on the first surface 111 and the electroplated copper layer 52 formed on the third surface 511 of the metal layer 51. That is to say, the first conductive circuit layer 20 is formed on the first surface 111.

In at least one exemplary embodiment, the second conductive circuit layer 30 is defined as the fourth surface 512 of the metal layer 51 formed on the second surface 112 and the electroplated copper layer 52 formed on the fourth surface 512 of the metal layer 51. That is to say, the second conductive circuit layer 30 is formed on the second surface 112.

The first conductive circuit layer 20 includes a plurality of first conductive circuits 21. The first conductive circuits 21 have a honeycomb structure 211. The honeycomb structure 211 has a plurality of first honeycomb holes 2111.

The second conductive circuit layer 30 includes a plurality of second conductive circuits 31. The second conductive circuits 31 also have a honeycomb structure 311. The honeycomb structure 311 has a plurality of second honeycomb holes 3111. Each second honeycomb hole 3111 corresponds to one first honeycomb hole 2111.

The printed circuit board 100 further includes a plurality of conductive via holes 40. The conductive via holes 40 run through the elastic base layer 11 and correspond to one first honeycomb hole 2111 and one second honeycomb hole 3111. Thus each conductive via hole 40 is electrically connected to one first conductive circuit 21 and one second conductive circuit 31.

The first and second honeycomb holes 2111 and the conductive via holes 40 are infilled by the first elastic cover layer 12 and the second elastic cover layer 13.

Figure 3:
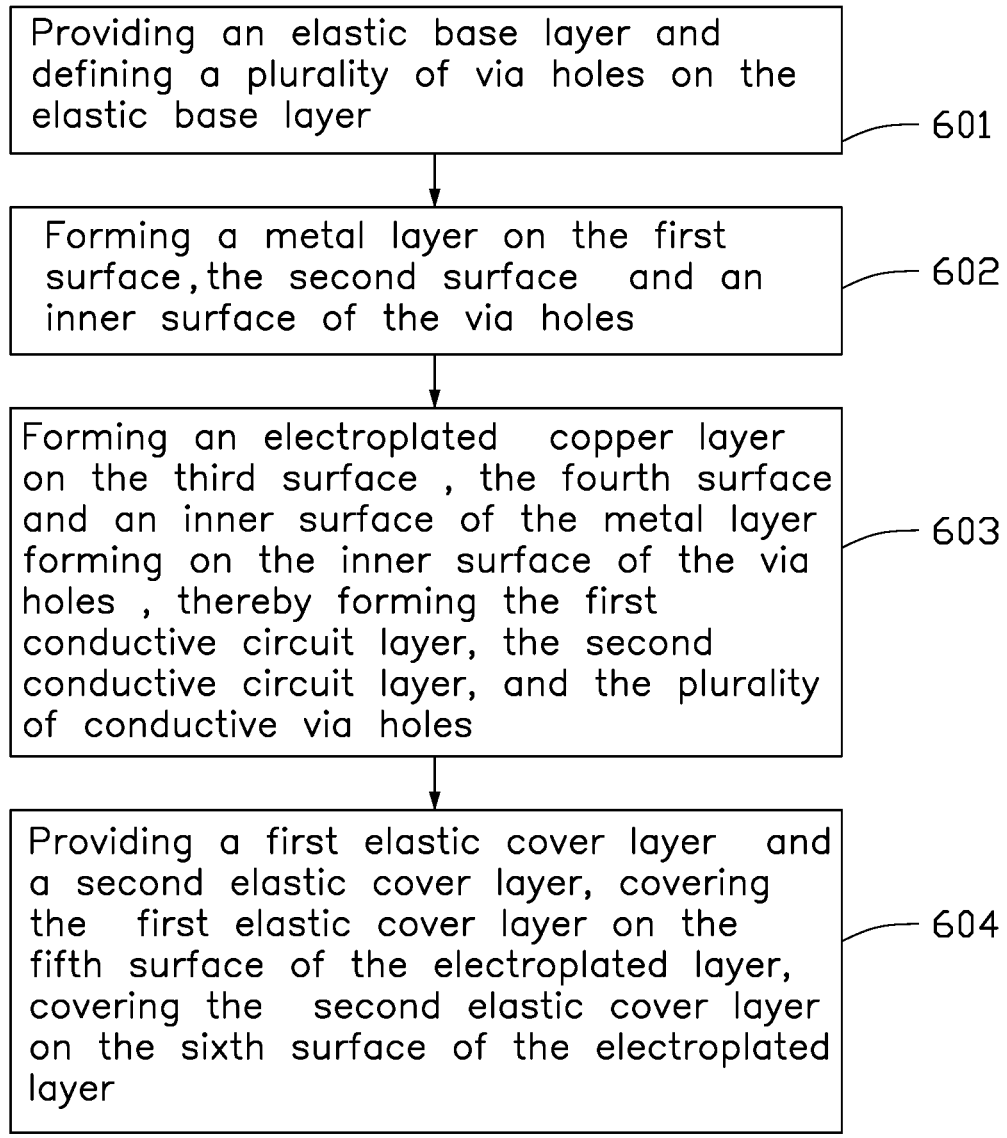
FIG. 3 is a flowchart of an exemplary embodiment of a method for manufacturing the printed circuit board of FIG. 1.

FIG. 3 illustrates a flowchart of a method for manufacturing a printed circuit board 100. The method is provided by way of example, as there are a variety of ways to carry out the method. The method described below can be carried out using the configurations illustrated in FIGS. 3-7 and 1, for example, and various elements of these figures are referenced in explaining example method. Each block shown in FIG. 3 represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method can begin at block 601.

Figure 4:
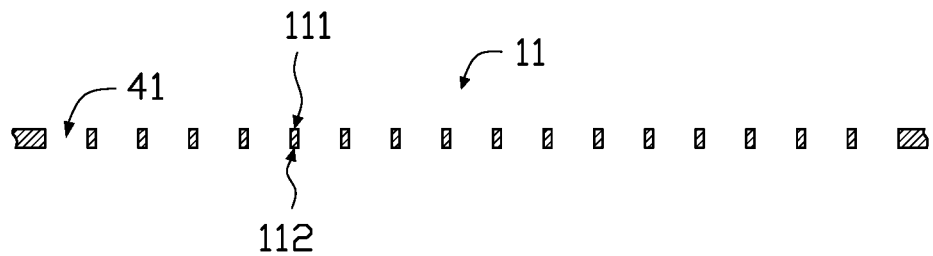
FIG. 4 is a cross-sectional view of an elastic via with via holes defined in the elastic via of the printed circuit board of FIG. 1.
Figure 5:
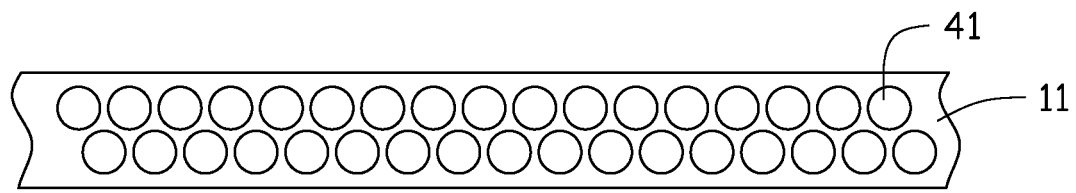
FIG. 5 is a top view of the elastic via of FIG. 4.

At block 601, as illustrated by FIGS. 4-5, an elastic base layer 11 is provided.

Via holes via 41 are defined in the elastic base layer 11.

The elastic via 11 includes a first surface 111 and a second surface 112 facing away from the first surface 111.

The via holes 41 run through the elastic base layer 11

The via holes 41 can be formed by one of machine drilling, laser drilling, and molding.

In at least one exemplary embodiment, the via holes 41 are formed by molding.

In at least one exemplary embodiment, the via holes 41 are circular in cross-section, as shown in FIG. 5.

In other exemplary embodiment, the via holes 41 are square or rhombic in cross-section.

In at least one exemplary embodiment, the elastic base layer 11 can be made of polydimethylsiloxane.

Figure 6:
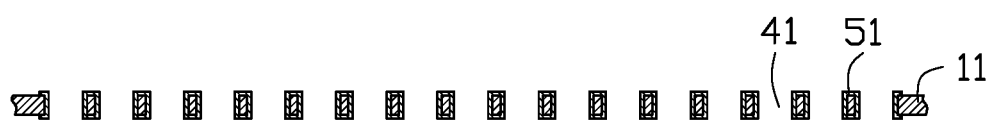
FIG. 6 is a cross-sectional view showing a metal layer formed in and around the via holes of the elastic via of FIG. 5.

At block 602, also as illustrated by FIG. 6, a metal layer 51 is formed on the first surface 111, the second surface 112, and an inner surface of the via holes 41.

The metal layer 51 includes a third surface 511 and a fourth surface 512 facing away from the third surface 511. The third surface 511 faces away from the first surface 111 and is on the same side with the first surface 111. The fourth surface 512 faces away from the second surface 112 and is on the same side with the second surface 112.

In at least one exemplary embodiment, the metal layer 51 is formed by a metal-sputtering process.

The metal can be gold, silver, copper, stannum, titanium, platinum, chromium, aluminum, or nickel.

In at least one exemplary embodiment, the metal layer 51 is a copper layer.

Figure 7:
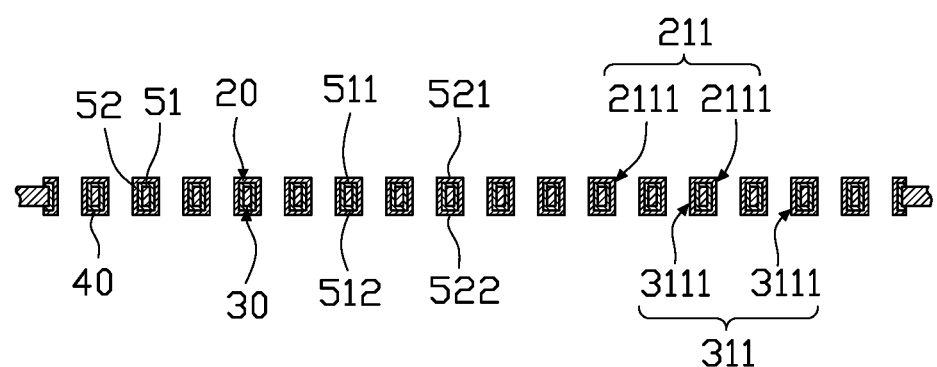
FIG. 7 is a cross-sectional view showing conductive circuit layers formed on the metal layer of FIG. 6.

At block 603, also as illustrated by FIG. 7, an electroplated copper layer 52 is formed on the third surface 511, the fourth surface 512, and an inner surface of the metal layer 51 formed on the inner surface of the via holes 41. Thereby, the first conductive circuit layer 20, the second conductive circuit layer 30, and the board holes 40 are formed.

In at least one exemplary embodiment, the first conductive circuit layer 20 is defined as the third surface 511 of the metal layer 51 formed on the first surface 111 and the electroplated copper layer 52 formed on the third surface 511 of the metal layer 51. That is to say, the first conductive circuit layer 20 is formed on the first surface 111.

In at least one exemplary embodiment, the second conductive circuit layer 30 is defined as the fourth surface 512 of the metal layer 51 formed on the second surface 112 and the electroplated copper layer 52 formed on the fourth surface 512 of the metal layer 51. That is to say, the second conductive circuit layer 30 is formed on the second surface 112.

The first conductive circuit layer 20 includes first conductive circuits 21. The first conductive circuits 21 have a honeycomb structure 211. The honeycomb structure 211 has first honeycomb holes 2111.

The second conductive circuit layer 30 includes second conductive circuits 31. The second conductive circuits 31 also have a honeycomb structure 311. The honeycomb structure 311 has second honeycomb holes 3111.

The conductive via holes 40 run through the elastic via 11 and correspond to one first honeycomb hole 2111 and one second honeycomb hole 3111. Thus each conductive via hole 40 is electrically connected to one first conductive circuit 21 and one second conductive circuit 31.

At block 604, also as illustrated by FIG. 1, a first elastic cover layer 12 and a second elastic cover layer 13 are provided. The first elastic cover layer 12 covers the fifth surface 521 of the electroplated copper layer 52. The second elastic cover layer 13 covers the sixth surface 522 of the electroplated copper layer 52.

The first elastic cover layer 12 and the second elastic cover layer 13 infill the first and second honeycomb holes 2111 and 3111, and the conductive via holes 40.

In at least one exemplary embodiment, the first elastic cover layer 12 and the second elastic cover layer 13 are made of polydimethylsiloxane.

In other exemplary embodiments, the electroplated copper layer 52 can be omitted.

With the above configuration, the board 100 being made of polydimethylsiloxane, the elastic film has conductive via holes 40, and the first and the second conductive circuit layers 20, 30 have first and second honeycomb holes 2111 and 3111, the conductive via holes 40 each correspond to one first and one second of the honeycomb holes 2111 and 3111. When the printed circuit board 100 is stretched along a first direction, the first and the second conductive circuits 21 and 31 are also stretched, but the first and second honeycomb holes 2111 and 3111 are thereby compressed along a second direction perpendicular to the first direction. The printed circuit board 100 is thus deformable in width and in length along any direction. Stretching of the first and the second conductive circuits 21 and 31 does not cause breaks or cracks because of the elasticity in all directions, and a signal transmission stability is improved.

The embodiments shown and described above are only examples. Many details are often found in the relevant art, therefore many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A printed circuit board deformable in both length and width comprising:
    a first conductive circuit layer, the first conductive circuit layer comprising first conductive circuits, first honeycomb holes defined on the first conductive circuits;
    a second conductive circuit layer, wherein the second conductive circuit layer faces away from the first conductive circuit layer, the second conductive circuit layer comprises second conductive circuits, second honeycomb holes defined on the second conductive circuits, each of the second honeycomb holes corresponds to one of the first honeycomb holes;
    an elastic film, wherein the elastic film comprises an elastic base layer, a first elastic cover layer, and a second elastic cover layer; wherein the elastic base layer, the first elastic cover layer, and the second elastic cover layer are electrically insulated from each other, the elastic base layer comprises a first surface and a second surface facing away from the first surface, the first conductive circuit layer is formed on the first surface, and the second conductive circuit layer is formed on the second surface; wherein the first elastic cover layer and the second elastic cover layer are located on opposite sides of the elastic base layer; and
    conductive via holes embedded in the elastic film, each of the conductive via holes electrically connected to one of the first conductive circuits and one of the second conductive circuits; wherein the elastic film is wrapped around the first conductive circuits and the second conductive circuits, one of the first honeycomb holes and one of the second honeycomb holes are defined on two opposite ends of each of the conductive via holes, the first conductive circuits have a first honeycomb structure, and the first honeycomb structure comprises the first honeycomb holes.

2. The printed circuit board of claim 1, wherein the second conductive circuit layer is embedded in the elastic film.

3. The printed circuit board of claim 1, wherein each of the first honeycomb holes, the second honeycomb holes, and the conductive via holes is filled by the first elastic cover layer and the second elastic cover layer.

4. The printed circuit board of claim 1, wherein the elastic base layer, the first conductive circuit layer, and the second conductive circuit layer are sandwiched between the first elastic cover layer and the second elastic cover layer.

5. The printed circuit board of claim 1, wherein the first conductive circuit layer comprises a part of a metal layer on the first surface and a part of an electroplated copper layer formed on the metal layer.

6. The printed circuit board of claim 4, wherein the first conductive circuit layer comprises a part of a metal layer on the first surface and a part of an electroplated copper layer formed on the metal layer, the metal layer comprises a third surface and a fourth surface facing away from the third surface, the third surface faces away from the first surface and on the same side with the first surface, the fourth surface faces away from the second surface and on the same side with the second surface, the electroplated copper layer is formed on the third surface and the fourth surface, the first conductive circuit layer is the metal layer formed on the first surface and the electroplated copper layer formed on the third surface of the metal layer, the second conductive circuit layer is the metal layer formed on the second surface and the electroplated copper layer formed on the fourth surface of the metal layer.

7. The printed circuit board of claim 5, wherein the first conductive circuit layer comprises a part of a metal layer on the first surface and a part of an electroplated copper layer formed on the metal layer, the electroplated copper layer comprises a fifth surface and a sixth surface facing away from the fifth surface, the fifth surface faces away from the third surface and on the same side with the first surface and the third surface, the sixth surface faces away from the fourth surface and on the same side with the fourth surface and the second surface, the first elastic cover layer is covered on the fifth surface of the electroplated copper layer, the second elastic cover layer is covered on the sixth surface of the electroplated copper layer.

8. The printed circuit board of claim 1, wherein each of the elastic base layer, the first elastic cover layer, and the second elastic cover layer is made of polydimethylsiloxane.

9. The printed circuit board of claim 1, wherein the second conductive circuits have a second honeycomb structure, and the second honeycomb structure comprises the second honeycomb holes.

\* \* \* \* \*